United States Patent
Wey et al.

(10) Patent No.: US 6,741,130 B2
(45) Date of Patent: May 25, 2004

(54) HIGH-SPEED OUTPUT TRANSCONDUCTANCE AMPLIFIER CAPABLE OF OPERATING AT DIFFERENT VOLTAGE LEVELS

(76) Inventors: Meng-Jer Wey, No. 13, Alley 31, Lane 46, Shuaili, Hsinchu (TW); Jeng-Huang Wu, 1F1, No. 24, Lane 168, Dahushanjuang St., Taipei (TW)

( * ) Notice: Subject to any disclaimer, the term of this patent is extended or adjusted under 35 U.S.C. 154(b) by 0 days.

(21) Appl. No.: 10/251,815

(22) Filed: Sep. 23, 2002

(65) Prior Publication Data

US 2004/0056716 A1 Mar. 25, 2004

(51) Int. Cl.[7] .................................................. H03F 3/45
(52) U.S. Cl. ........................................ 330/253; 330/257
(58) Field of Search ................................ 330/253, 257; 327/359

(56) References Cited

U.S. PATENT DOCUMENTS

| | | | | |
|---|---|---|---|---|
| 5,594,386 A | * | 1/1997 | Dhuyvetter | 330/253 |
| 5,764,086 A | * | 6/1998 | Nagamatsu et al. | 327/65 |
| 6,028,464 A | * | 2/2000 | Bremner | 330/253 |
| 6,452,448 B1 | * | 9/2002 | Bonaccio et al. | 330/253 |
| 6,535,031 B1 | * | 3/2003 | Nguyen et al. | 330/253 |

* cited by examiner

Primary Examiner—Khanh Van Nguyen
(74) Attorney, Agent, or Firm—Rabin & Berdo, P.C.

(57) ABSTRACT

A high-speed output transconductance amplifier (OTA) capable of operating at different voltage levels. The high-speed output transconductance amplifier configures a cross-coupled circuit with programmable switches to offer a high-speed receiver capable of operating at lower voltage and normal voltage, for example, a receiver can be operated in both for SSTL-3 (3.3V system) and SSTL-2 (2.5V system).

8 Claims, 3 Drawing Sheets

HIGH-SPEED OUTPUT TRANSCONDUCTANCE AMPLIFIER CAPABLE OF OPERATING AT DIFFERENT VOLTAGE LEVELS

BACKGROUND OF THE INVENTION

1. Field of the Invention

The invention relates to a high-speed output transconductance amplifier (OTA), which configures a cross-coupled circuit with programmable switches to offer a high-speed receiver capable of operating at different voltage levels.

2. Description of Related Art

An application example of a typical output transconductance amplifier (OTA) in an existing high speed receiver is given as follows.

FIG. 1 is a circuit diagram of a typical OTA 10. In FIG. 1, the OTA 10 is formed by an NMOS current mirror circuit M1–M2, two PMOS current mirror circuits M3–M4, M5–M6 and a differential operational amplifier M7–M9. As shown in FIG. 1, the NMOS current mirror circuit includes NMOS transistors M1–M2 with common gates and common grounding sources, wherein a drain of transistors M1 is connected to the common gate providing a current mirror function. The NMOS transistor M9 acts as a current source providing a reference current $I_{ABC}$ controlled by a differential voltage pair REF, IN respectively connected to gates of transistors M8, M7. Thus, DC power dissipation from output-to-input thermal feedback (because in the layout, transistors M7 and M8 are placed next to transistors M2 and M3) is decreased by adjusting the reference current through input voltages of REF, IN. Additionally, the symmetric diode configuration of transistors M4 and M5 in parallel respectively with transistors M3 and M6 is a voltage to current converter and sends the current through transistors M3 and M6. In this diode configuration, it can keep transistors M7 and M8 saturated and provide a high resistance region in the middle for transistors M3 and M6 so the output switches faster to minimize delay. The OTA is a current steering circuit with an output current Io. The output current Io can be represented by the differential input voltages IN, REF:

$$Io = gm(IN - REF)$$

where, gm is the transconductance gain equal to $I_{ABC}/2V_T$, and $V_T$ is the threshold voltage of an MOS device.

However, although this OTA 10 can provide suitable current to ensure function correctly (e.g. using a 3.3V device in an SSTL-3, 3.3V system), but for a lower voltage system (e.g. using a 3.3V device in an SSTL-2, 2.5V system), it will not operate to function correctly. This is because the differential pair M7 and M8 may limit the output signal range and increase the susceptibility to device mismatching due to square-law behavior of a device in saturation. Further, a current mirror ratio B has to decrease in order to reach the requested gain gm (see MARC G. R. DEGRAUWE and WILLY M. C. SANSEN, "The Current Efficiency of MOS Transconductance Amplifiers," IEEE Journal of Solid-State Circuits, Vol. SC-19, No. 3, June 1984.)

SUMMARY OF THE INVENTION

Accordingly, an object of the invention is providing a high-speed output transconductance amplifier capable of operating at different voltage levels by means of switching on or off the extra cross-coupled circuit.

The invention provides a high-speed output transconductance amplifier capable of operating at different voltage levels, including an NMOS current mirror circuit consisting of a first NMOS transistor with a drain, a gate and a diode-configured NMOS with a drain and a gate connected to the gate of the first NMOS and the drain of the diode-configured NMOS transistor; two PMOS current mirror circuits consisting of a first PMOS transistor with a gate and a drain connected to the drain of the first NMOS transistor to form a connection point as an output terminal, a second PMOS transistor with a gate and a drain connected to the drain of the diode-configured NMOS transistor, a first diode-configured PMOS transistor with a drain and a gate connecting the drain of the first diode-configured PMOS transistor and the gate of the first PMOS transistor, and a second diode-configured PMOS transistor with a drain and a gate connected to the drain of the second diode-configured PMOS transistor and the gate of the second PMOS transistor; a cross-coupled circuit consisting of a first cross-coupled unit having a first programmable switch and a third PMOS transistor connected in parallel to the first diode-configured PMOS transistor, with a gate connected to the first switch, and a second cross-coupled unit having a second programmable switch and a fourth PMOS transistor connected in parallel to the second diode-configured PMOS transistor, with a gate connected to the second switch; and a differential operational amplifier consisting of a second NMOS transistor with a drain connected to the first switch and the drain of the second diode-configured PMOS transistor, a gate connected to a first voltage, and a source, a third NMOS transistor with a drain connected the second switch and the drain of the first diode-configured PMOS transistor, a gate connected to a second voltage, and a source, and a fourth NMOS transistor with a drain connected to the sources of the second and third NMOS transistors and a gate connected to a third voltage, wherein the fourth NMOS transistor, the third NMOS transistor, and the first diode-configured NMOS transistor respectively are grounded, and all PMOS transistors respectively have a source connected to an external voltage.

DETAILED DESCRIPTION OF THE INVENTION

The following numbers denote the same elements throughout the description and drawings.

Figure 1:
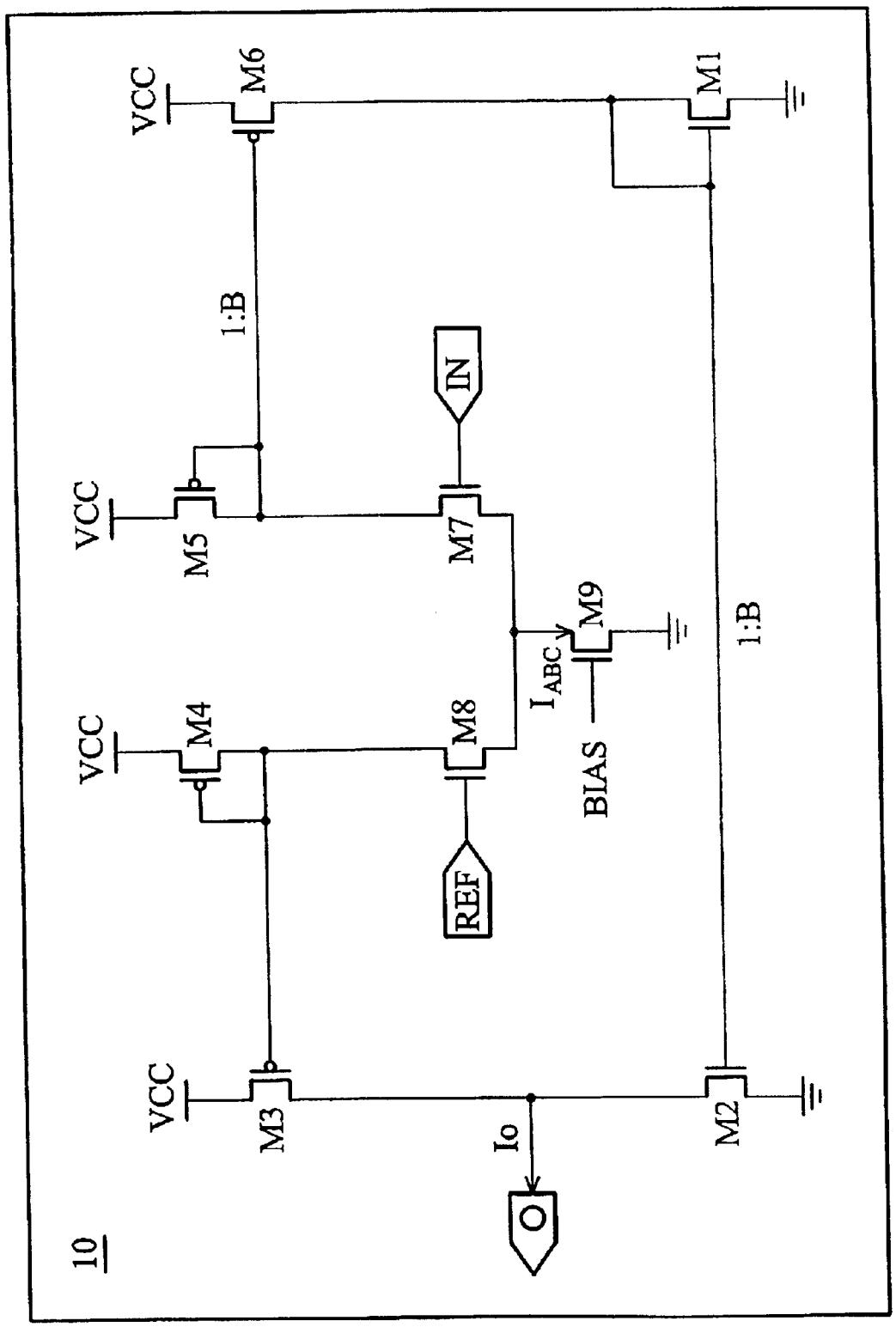
FIG. 1 is a circuit diagram of a typical OTA.
Figure 2:
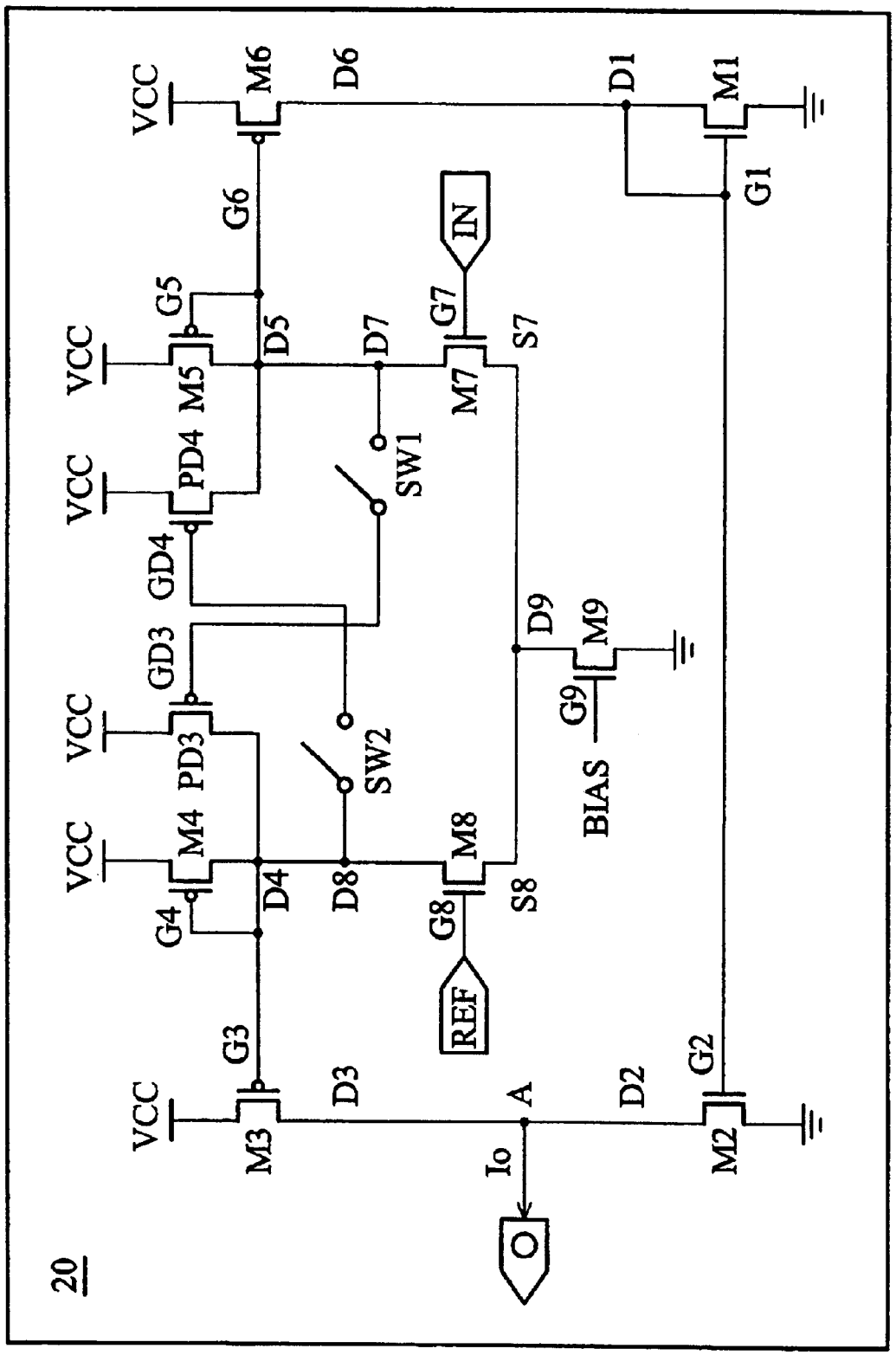
FIG. 2 is a circuit diagram of an OTA according to the invention.

FIG. 2 is a circuit diagram of an OTA 20 according to the invention. In FIG. 2, the circuit includes an NMOS current mirror circuit consisting of a first NMOS M2 with a drain D2, a gate G2 and a diode-configured NMOS M1 with a drain D1 and a gate G1 connected to the gate G2 of the first NMOS M2 and the drain D1 of the diode-configured NMOS M1; two PMOS current mirror circuits consisting of a first PMOS M3 with a gate G3 and a drain D3 connected to the drain D2 of the first NMOS M2 to form a connection point A as an output terminal, a second PMOS M6 with a gate G6 and a drain D6 connected to the drain D1 of the diode-configured NMOS M1, a first diode-configured PMOS M4 with a drain D4 and a gate G4 connected the drain D4 of the first diode-configured PMOS M4 and the gate G3 of the first PMOS M3, and a second diode-configured PMOS M5 with a drain D5 and a gate G5 connected to the drain D5 of the second diode-configured PMOS M5 and the gate G6 of the second PMOS M6; a cross-coupled circuit consisting of a first cross-coupled unit having a first programmable switch SW1 and a third PMOS PD3 connected in parallel to the first diode-configured PMOS M4, with a gate GD3 connected to the first switch SW1, and a second cross-coupled unit having a second programmable switch SW2 and a fourth PMOS PD4 connected in parallel to the second diode-configured PMOS M5, with a gate GD4 connected to the second switch SW2; and a differential operational amplifier consisting of a second NMOS M7 with a drain D7 connected to the first switch SW1 and the drain D5 of the second diode-configured PMOS M5, a gate G7 connected to a first voltage IN, and a source S7, a third NMOS M8 with a drain D8 connected the second switch SW2 and the drain D4 of the first diode-configured PMOS M4, a gate G8 connected to a second voltage REF, and a source s8, and a fourth NMOS M9 with a drain D9 connected to the sources S7, S8 of the second and third NMOSs and a gate G9 connected to a third voltage BIAS, wherein the first NMOS, the third NMOS, and the first diode-configured NMOS are, respectively, grounded, and all PMOSs respectively have a source connected to an external voltage VCC. The external voltage VCC, the first voltage IN, the second voltage REF and the third voltage BIAS are respectively an external operating voltage providing an operating voltage, an input voltage providing a positive input voltage, a reference voltage providing a negative input voltage and a bias voltage, to control the device M9 that is a fixed current source, to switch between the devices M8 and M9. The programmable switches SW1 and SW2 can be fuses, transistors, or MOSFETs.

As shown in FIG. 2, this circuit, compared to the prior art, adds a cross-coupled unit pair, each including a PMOS transistor and a programmable switch.

When switches SW1 and SW2 are opened (switches off), the circuit acts identically to the prior circuit. As such, the circuit can work well in a higher input/output voltage like 3.3V device operated for an SSTL-3 system. When switches SW1 and SW2 are closed (switches on), because the differential voltage between terminals D4 and D5 is increased by the cross-coupled circuit, the external power VCC need not reach 3.3V when operating the entire circuit in saturation. As such, the external voltage only needs a lower operating voltage as low as 2.5V for a 3.3V device operated for SSTL-2 system.

Figure 3:
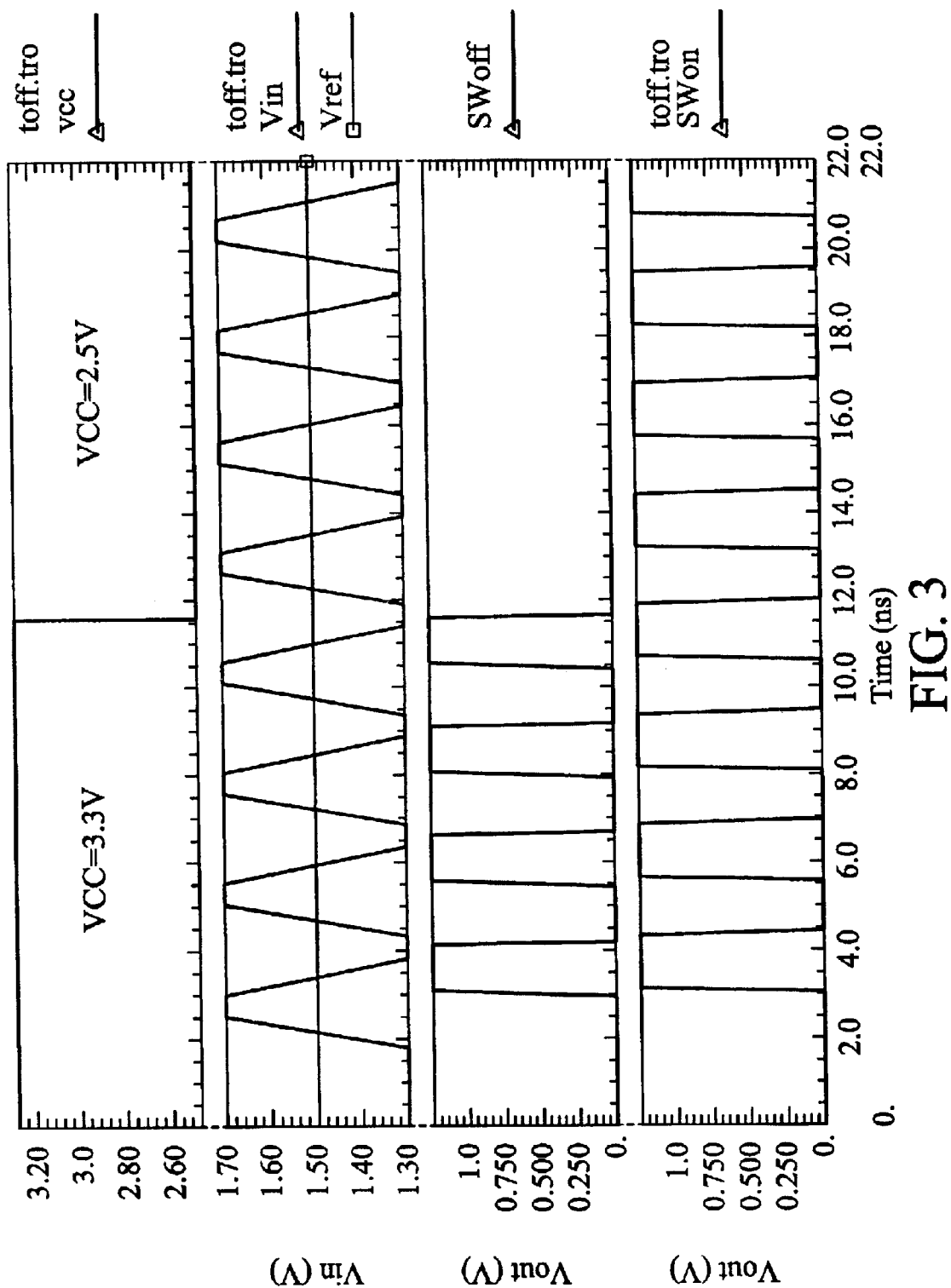
FIG. 3 is a diagram of an output voltage waveform of FIG. 2 when the switches are on and off.

FIG. 3 is a diagram of an output voltage of FIG. 2 between the switches are turned on SWon and turned off SWoff. As shown in FIG. 3, for the case of VCC=3.3V (normal voltage) and 2.5V (lower voltage) (the top figure), when a voltage Vin inputs with reference to a constant reference Vref about 1.5V (next one), the circuit is not capable of operation at low voltages as low as 2.5V if the switches are turned off SWoff (next one), otherwise the circuit can operate at low voltages as low as 2.5V and at high voltages as high as 3.3V under the control of the cross-coupled circuit (the bottom one).

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A high-speed output transconductance amplifier (OTA) capable of operating at different voltage levels, comprising:

an NMOS current mirror circuit consisting of a first NMOS with a drain and a gate, and a diode-configured NMOS with a drain and a gate connected to the gate of the first NMOS and the drain of the diode-configured NMOS;

two PMOS current mirror circuits consisting of a first PMOS with a gate and a drain connected to the drain of the first NMOS to form a connection point as an output terminal, a second PMOS with a gate and a drain connected to the drain of the diode-configured NMOS, a first diode-configured PMOS with a drain and a gate connected the drain of the first diode-configured PMOS and the gate of the first PMOS, and a second diode-configured PMOS with a drain and a gate connected to the drain of the second diode-configured PMOS and the gate of the second PMOS;

a cross-coupled circuit consisting of a first cross-coupled unit having a first programmable switch and a third PMOS connected in parallel to the first PMOS, with a gate connected to the first programmable switch, and a second cross-coupled unit having a second programmable switch and a fourth PMOS connected in parallel to the second diode-configured PMOS, with a gate connected to the second programmable switch; and a differential operational amplifier consisting of a second NMOS with a drain connected to the first switch and the drain of the second diode-configured PMOS, a gate connected to a first voltage, and a source, a third NMOS with a drain connected to the second switch and the drain of the first diode-configured PMOS, a gate connected to a second voltage, and a source, and a fourth NMOS with a drain connected to the sources of the second and third NMOSs and a gate connected to a third voltage, wherein the first NMOS, the fourth NMOS, and the first diode-configured NMOS respectively are grounded.

2. The high-speed output transconductance amplifier (OTA) capable of operating at different voltage levels of claim 1, wherein all PMOSs respectively have a source connected to an external voltage.

3. The high-speed output transconductance amplifier (OTA) capable of operating at different voltage levels of claim 2, wherein the external voltage is operating at normal voltage level when the programmable switches are switched off.

4. The high-speed output transconductance amplifier (OTA) capable of operating at different voltage levels of claim 2, wherein the external voltage is operating at lower voltage level when the programmable switches are switched on.

5. The high-speed output transconductance amplifier (OTA) capable of operating at different voltage levels of claim 1, wherein the first voltage, the second voltage and the third voltage are respectively an input voltage, a reference voltage and a bias voltage.

6. The high-speed output transconductance amplifier (OTA) capable of operating at different voltage levels of claim 1, wherein the programmable switches are fuses.

7. The high-speed output transconductance amplifier (OTA) capable of operating at different voltage levels of claim 1, wherein the programmable switches are transistors.

8. The high-speed output transconductance amplifier (OTA) capable of operating at low voltages of claim 1, wherein the programmable switches are MOSFETs.

* * * * *